United States Patent [19]

Okumura et al.

[11] 4,177,096
[45] Dec. 4, 1979

[54] METHOD FOR MANUFACTURING A SEMICONDUCTOR INTEGRATED CIRCUIT DEVICE

[75] Inventors: Tomisaburo Okumura, Kyoto; Hiroshi Okazaki, Takatsuki; Akira Tsuchitani, Johyo, all of Japan

[73] Assignee: Matsushita Electronics Corporation, Osaka, Japan

[21] Appl. No.: 762,301

[22] Filed: Jan. 25, 1977

[30] Foreign Application Priority Data

Jan. 30, 1976 [JP] Japan .................................. 51/9870

[51] Int. Cl.² .............................................. H01L 21/22
[52] U.S. Cl. ...................................... 148/187; 29/571; 357/45
[58] Field of Search ........................... 148/187; 357/45; 29/571

[56] References Cited

U.S. PATENT DOCUMENTS

| | | | |
|---|---|---|---|
| 3,865,651 | 2/1975 | Arita | 148/187 |
| 3,893,152 | 7/1975 | Lin | 357/45 X |
| 3,921,282 | 11/1975 | Cunningham et al. | 29/571 |
| 3,921,283 | 11/1975 | Shappir | 29/571 |
| 3,933,540 | 1/1976 | Kondo et al. | 148/187 |
| 3,985,591 | 10/1976 | Arita | 148/187 |
| 3,996,077 | 12/1976 | Verkuijlen | 148/187 |
| 4,008,107 | 2/1977 | Hayasaka et al. | 148/175 |
| 4,021,789 | 5/1977 | Furman et al. | 148/187 X |

*Primary Examiner*—G. Ozaki
*Attorney, Agent, or Firm*—Stevens, Davis, Miller & Mosher

[57] ABSTRACT

In manufacturing an insulated gate field effect transistor integrated circuit using both a self-alignment diffusion process and a non-self-alignment diffusion process, a mask is formed having a combined pattern of areas at which a subsequent self-alignment diffusion and a non-self-alignment diffusion will occur. An oxidation prevention layer for preventing thermal oxidation of a substrate is selectively formed on a semiconductor substrate using the prepared mask. Those areas of the semiconductor substrate which are not covered by the oxidation prevention layer are oxidized by thermal oxidation to form oxidized layers thereon, and impurities are diffused first in the areas of the substrate corresponding to the non-self-alignment portion of the mask pattern and subsequently in the areas of the substrate corresponding to the self-alignment portions of the mask pattern to build in an insulated gate field effect transistor network. According to the present method, the height of stepped areas produced in the insulating layer on the semiconductor substrate are minimized so that the breakage of the metallized pattern which extends over the stepped areas is prevented.

4 Claims, 14 Drawing Figures

F I G. 2a
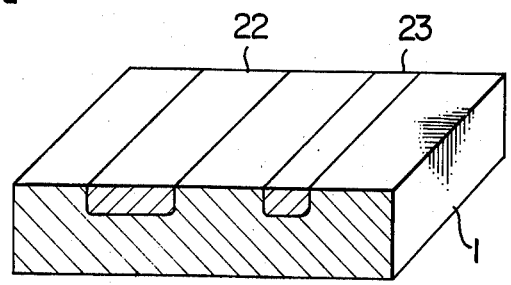
F I G. 2b
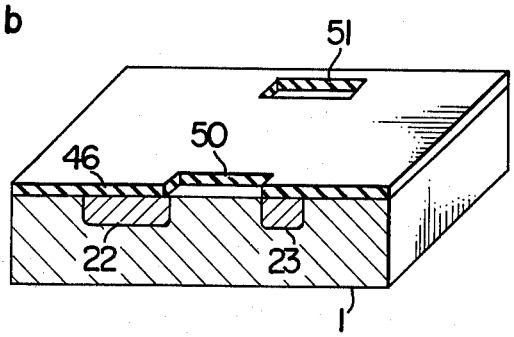
F I G. 2c
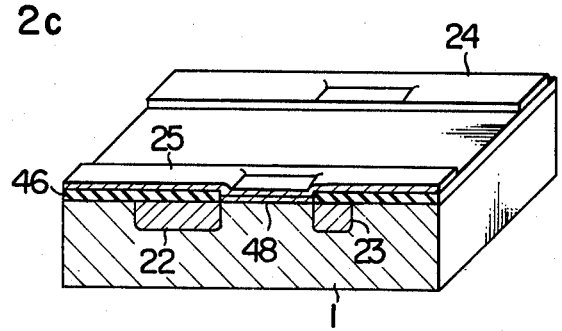

METHOD FOR MANUFACTURING A SEMICONDUCTOR INTEGRATED CIRCUIT DEVICE

The present invention relates to a method for manufacturing a semiconductor integrated circuit device, and, more particularly, to an improved method for manufacturing a semiconductor integrated circuit device which minimizes the height of the steps produced in an insulating layer on a semiconductor substrate t prevent the breakage of a metallized pattern extending over the stepped areas.

In U.S. Pat. No. 3,985,591 a method has been proposed in which a MOS transistor is built in a self-alignment type MOS large scale integrated circuit (MOS LSI) by using a non-self-alignment process, i.e., by merely forming predetermined diffusion regions. This method enables formation of a parallel-gate matrix circuit by merely adding certain processes to a series-gate matrix circuit formed by a self-alignment process.

In the U.S. Pat. No. 3,865,651 a method has been proposed in which any desired series-gate matrix circuit is formed by the self-alignment process by forming a required number of pre-diffusion regions at predetermined areas in a silicon substrate.

While those methods are very effective in manufacturing a large scale integrated circuit in which a number of matrix circuits are constructed, they have a disadvantage in that high stepped areas of the insulating oxide layer are produced and when a metallized pattern is formed on the stepped areas in manufacturing a high density LSI, the metallized pattern is apt to be broken in a subsequent photoresist and etching processes, while the thickness of the metallized pattern is reduced at the stepped areas thereby reducing current capacity of the metallized pattern.

Accordingly, an object of the present invention is to provide a method for manufacturing a semiconductor integrated circuit device of a high density LSI in which the height of stepped areas produced in an insulating layer formed on a substrate are minimized so that the the breakage of a metallized pattern extending over the stepped areas is prevented.

It is another object of the present invention to provide a method for manufacturing a semiconductor integrated circuit device which uses both a self-alignment diffusion process and a non-self-alignment diffusion process and which is suitable for a high density LSI to effectively enhance the yield.

FIGS. 2(a) to (c) show manufacturing steps of the MOS LSI non-self-aligned MOS transistor shown in FIG. 1.

Figure 3:
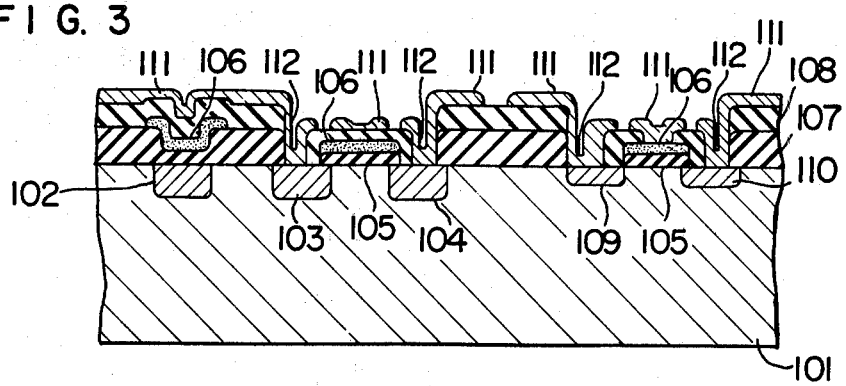

FIG. 3 is a sectional view of a MOS LSI formed using both a non-self-alignment diffusion process and a self-alignment diffusion process.

FIGS. 4 to 11 are partial sectional views illustrating manufacturing steps for a MOS LSI in accordance with a manufacturing method of the present invention.

Referring to the accompanying drawings, the previously proposed method is first explained.

Figure 1A:
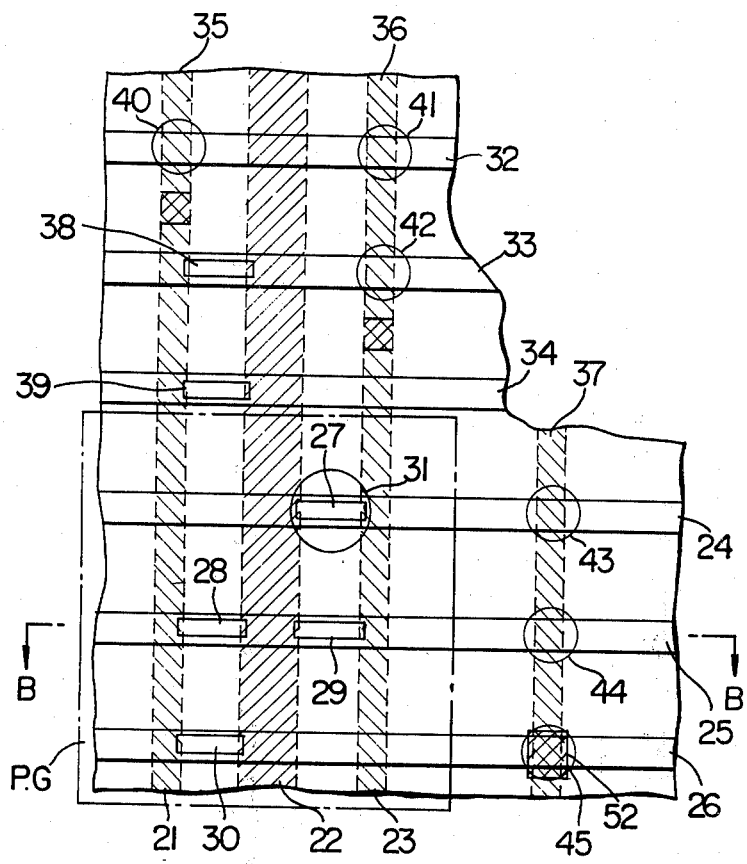
FIG. 1(a) is a schematic plan view of a major portion of a MOS LSI previously proposed.

FIGS. 1(a) and (b) are a partial sectional view and a partial plan view, in an enlarged scale, respectively, of a MOS LSI having a parallel-gate matrix circuit formed therein by the method outlined above. In FIGS. 1(a) and (b), numerals 21 to 23 denote diffusion regions of the opposite conductivity type to that of a silicon substrate which were previously formed in the silicon substrate; numerals 24, 25 and 26 denote gate electrode layers formed in a relation to cross orthogonally with the diffusion regions 21 to 23; and, numerals 27 to 30 denote portions which act as gates of MOS field effect transistors forming a parallel-gate matrix circuit PG. For example, a MOS field effect transistor is formed at an area 31. Numerals 32, 33 and 34 denote other gate electrode layers; hatched areas 35, 36 and 37 denote impurity diffusion regions for forming self-aligned transistors; numerals 38 and 39 denote areas, similar to the portions 27 to 30, which act as gates of non-self-aligned MOS transistors; and, numerals 40 to 44 denote MOS field effect transistors formed by the self-alignment process.

Figure 1B:
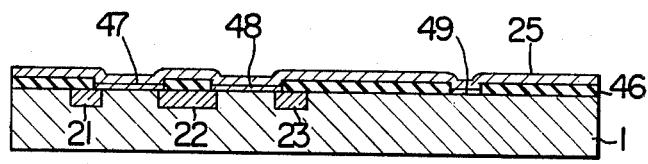
FIG. 1(b) is a sectional view taken along a line B—B in FIG. 1(a).

FIG. 1(b) is a sectional view taken along a line B—B in FIG. 1(a) to clearly illustrate the MOS field effect transistors forming the parallel gate matrix previously proposed. As shown in FIG. 1(b), portions of a silicon oxide layer 46 covering the surface of the silicon substrate 1 in which the diffusion regions 21, 22 and 23 are formed are removed to form openings, at which gate oxide layers 47, 48 and 49 are formed with the gate electrode layer 25 overlying thereon. At the area where the gate oxide layer 49 exists, the self-alignment MOS field effect transistor 44 is formed during a subsequent diffusion process. In the previously proposed method, a diffusion mask for the self-alignment process can be used as a mask pattern for forming regions 27 to 30 and 38 and 39 which act as gates for non-self-aligned MOS field effect transistors. Namely, all steps other than that of preforming the diffusion regions 21, 22 and 23 may be common to the steps related to the self-alignment process.

FIGS. 2(a) to (c) illustrate manufacturing steps for the MOS field effect transistor of the PG section. The structure shown in FIG. 1 can be formed by the following steps. First, formed in the silicon substrate 1 of one conductivity type are diffusion regions, e.g., 22 and 23, of an opposite conductivity type in parallel relation to each other as shown in FIG. 2(a). During this diffusion step, the silicon oxide layer 46 is formed over the entire surface of the silicon substrate as shown in FIG. 2(b). Predetermined portions of the silicon oxide layer covering the silicon substrate lying between the diffusion regions 22 and 23 are etched away to form openings 50 and 51. These openings may be formed simultaneously with the formation of the diffusion windows using a diffusion mask for the self-alignment process. The openings formed in the silicon oxide layer determine the locations of the MOS field effect transistors and hence the configuration of the matrix circuit. Accordingly, it is important that they are provided taking into consideration the matrix circuit to be built in the silicon substrate.

After the openings 50 and 51 have been formed, the gate oxide layers 48 and 49 are formed at the openings and then the gate electrode layers 24 and 25 are formed as shown in FIG. 2(c) to form the MOS field effect transistors only at the predetermined areas of the silicon substrate.

According to the method described above, although the diffusion regions performed in the silicon substrate are utilized as drain and source, the MOS field effect transistor thus formed has small portions which overlap between the drain or source region and the gate electrode region, as shown in FIG. 2(c), like the MOS field effect transistor formed by the self-alignment process, and hence has little gate parasitic capacitance. That is, it has an improved frequency characteristic. Furthermore, in accordance with the method described above, the construction of the MOS field effect transistor is substantially governed by the formation of the gate region and freedom is given for the formation of the gate region. Accordingly, by appropriately selecting the location of the gate region, any parallel gate matrix circuit can be formed simultaneously with the construction of the MOS field effect transistor. Therefore, this method is advantageous in constructing a matrix circuit in the LSI device.

The method of the U.S. Pat. No. 3,865,651 is now explained with reference to FIG. 1(a). In this method, a diffusion region 52 is previously formed under the gate electrode layer 26. As a result, the source and drain of a spurious MOS transistor can be connected without using a surface electrode so that a desired series gate matrix circuit can be formed.

While the methods described above are very effective for an LSI device in which a number of matrix circuits are constructed, an improvement of the yield is strongly desired as the demand for higher density in such LSI devices increases. Particularly, in manufacturing the LSI device by a process for forming a silicon gate MOS LSI previously proposed by the applicant, as the packing density increases, an additional insulating layer is formed on a polysilicon wiring pattern to allow three-dimensional crossing of the wiring patterns, and contact windows are formed in the insulating layer overlying diffusion layers and a metallized pattern to be connected to the diffusion layers is formed on the insulating layer.

However, where such a metallized pattern is formed, very high stepped area of the insulating oxide layer are formed. As a result, the metallized pattern of aluminum thin film is apt to be broken during the photoresist and etching processes.

FIG. 3 shows an enlarged partial sectional view of a MOS semiconductor integrated circuit device formed by the method illustrated in FIG. 2, that is, by using both non-self-alignment diffusion process and self-alignment diffusion process.

In FIG. 3, numeral 101 denotes a silicon substrate of one conductivity type, 102 a non-self-alignment diffusion region for interconnection, of opposite conductivity type to that of the silicon substrate, 103 and 104 a drain region and a source region, respectively, formed by non-self-alignment diffusion process, 105 a gate oxide layer, 106 a polysilicon layer, 107 a thermal oxidation layer, 108 an oxide layer, 109 and 110 a drain region and a source region, respectively, formed by self-alignment diffusion process, and 111 an aluminum layer. As is apparent from the drawing, in such a MOS semiconductor integrated circuit device, when windows are formed in the oxide layer over the drain region and the source region to interconnect metallized patterns of the aluminum layer 111 to those regions, high steps are formed on the oxide layer and as a result the thickness of the metallized patterns extending over those steps is reduced at the stepped area and, in addition, grooves 112 are formed in the metallized patterns. Therefore, in a subsequent etching process to the metallized patterns using a photoresist coating, the metallized patterns may be broken at the stepped areas. Furthermore, because the thickness of the metallized patterns is reduced at the stepped areas, current capacity of the metallized pattern is also reduced.

The present invention provides a method for manufacturing a semiconductor integrated circuit device which eliminates the above disadvantages. The manufacturing method of the present invention will now be described in detail with reference to FIGS. 4 to 11 which illustrate manufacturing steps of one embodiment of the present invention.

Figure 4:
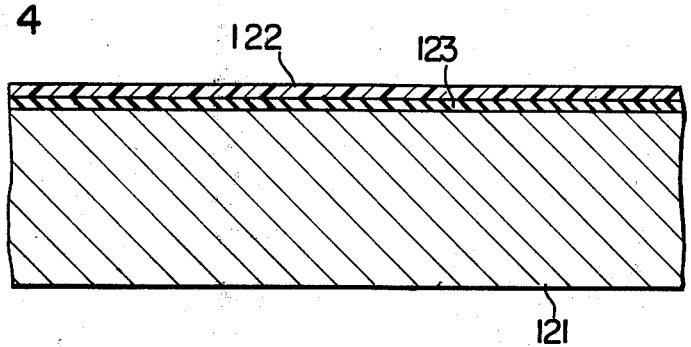

FIG. 4 is a sectional view of a silicon substrate 121 over which a silicon nitride layer $Si_3N_4$ 122 is formed. A thin oxide layer may be formed between the silicon substrate 121 and the silicon nitride layer 122 to enhance the adherence of the silicon nitride layer 122 to the substrate. Numeral 123 denotes such a thin oxide layer formed for this purpose.

Figure 5:
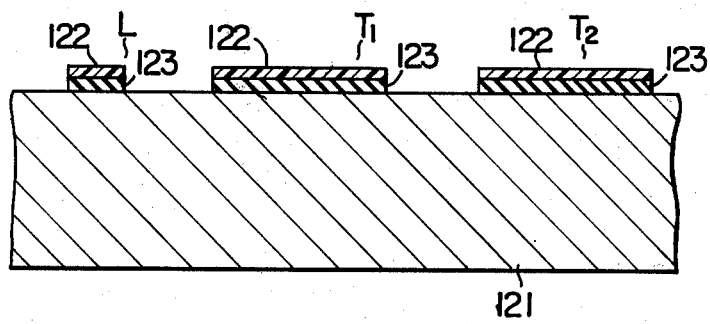

FIG. 5 shows a sectional view in which portions of the silicon nitride layer 122 have been removed by etching process using a photoresist while leaving the other portions unremoved. On the unremoved portions, non-self-alignment diffusion L (e.g., diffusion layer 52 in FIG. 1a) for forming a non-self-aligned transistor $T_1$ (e.g., transistor formed at the area 31 in FIG. 1a) to be described later and a diffusion layer to be used as an interconnection, and self-alignment diffusion for forming a self-aligned transistor $T_2$ (e.g., transistors formed at areas 40 to 44 in FIG. 1a) and a diffusion layer to be used as an interconnection are sequentially carried out.

Figure 6:
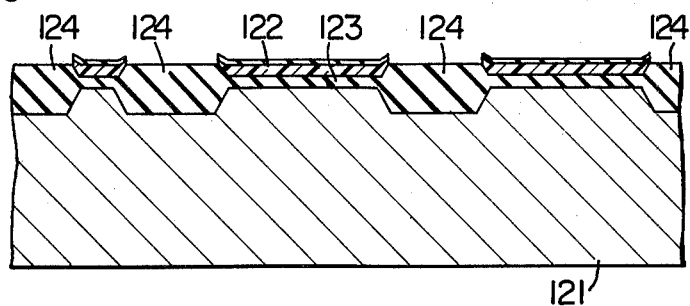

FIG. 6 shows a sectional view of the substrate of FIG. 5 after having been subjected to a heat treatment at an elevated temperature for a long time. As shown in FIG. 6, those portions of the silicon substrate which are not covered by the silicon nitride layer 122 but are exposed have been oxidized to form $SiO_2$ regions 124. The silicon nitride layer 122 has also been oxidized on the surface thereof. When the silicon is oxidized to $SiO_2$, the volume thereof is approximately doubled. Accordingly, one half of the $SiO_2$ regions 124 is formed above the substrate 121 and the other half is formed in the substrate 121. As a result, the distance from the top surface of the substrate 121 to the top surface of the oxide layer 124 ($SiO_2$) is reduced by a factor of two in comparison with the thickness of the $SiO_2$ layer 124. Such a local oxidation process is described, e.g., in the article entitled "Local Oxidation of Silicon and Its Application in Semiconductor Device Technology," Philips Research Reports, Vol. 25, 1970, pp 118–132.

Figure 7:
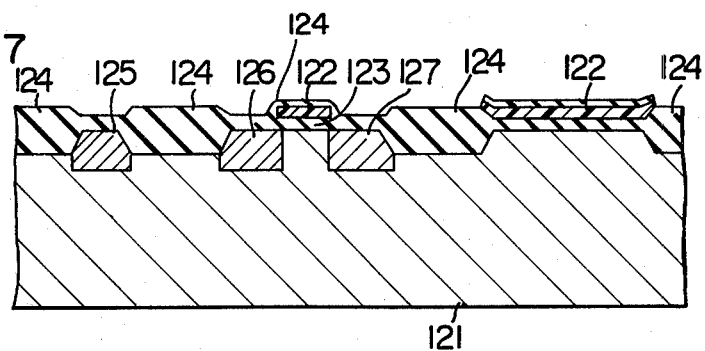

In FIG. 7, the silicon nitride layer and the underlying thin oxide layer have been removed at the non-self-aligned diffusion areas and diffusion process has been carried out thereat to form diffusion regions 125 to 127. In the drawing, numeral 125 denotes an interconnection diffusion region, 126 a drain region and 127 a source region.

Figure 8:
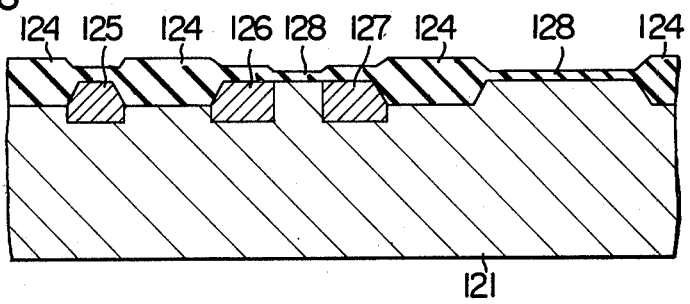

In FIG. 8, the entire silicon nitride layer 122 remaining on the silicon substrate 121 and the underlying thin oxide layer have been removed and the substrate has been subjected to a thermal oxidation process by which a thermal oxidation layer having the thickness of several hundreds Å to 1500 Å is formed at the exposed areas of the silicon. An oxide layer 128 has been formed during the thermal oxidation process, this acts as a gate oxide layer.

Figure 9:
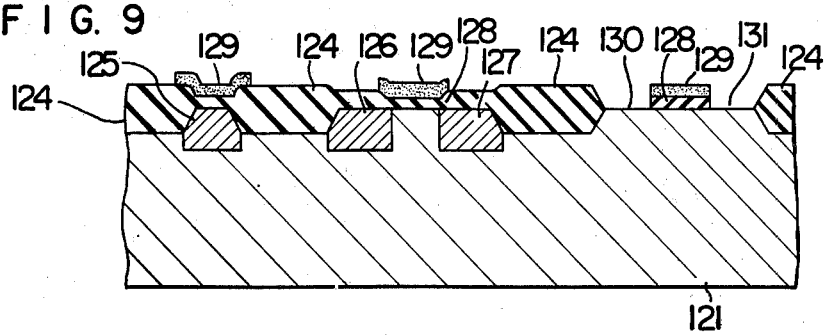

Subsequently, a polysilicon layer having the thickness of 2000 Å to 6000 Å is formed on the entire surface and it is selectively etched away while leaving desired portions unremoved. Using the polysilicon layer as a mask, the gate oxide layer 128 is etched to form windows 130 and 131 through which impurities are to be diffused. FIG. 9 shows a structure after the completion of the above process, in which numeral 129 denotes the polysilicon layer.

Figure 10:
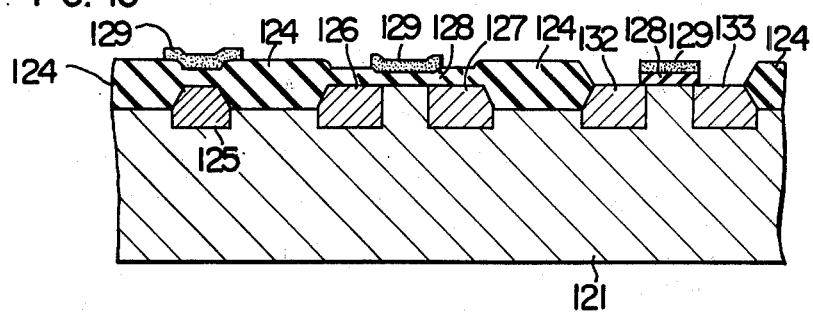

FIG. 10 shows a structure in which impurities have been diffused through the windows 130 and 131 shown in FIG. 9 to form diffusion regions 132 and 133. What is formed by the above diffusion are source and drain of the self-aligned transistor and the interconnection region thereto. Since the non-self-aligned diffusion region explained in connection with FIG. 7, e.g., the diffusion region 125, is formed prior to the formation of the polysilicon layer which is formed in the process of FIG. 9, it is possible to interconnect the self-aligned diffusion region formed in FIG. 10 with other self-aligned diffusion regions, not shown, (i.e., diffusion regions on both sides of the gate 26 in FIG. 1a) even when the polysilicon layer exists between the self-aligned diffusion layers.

Figure 11:
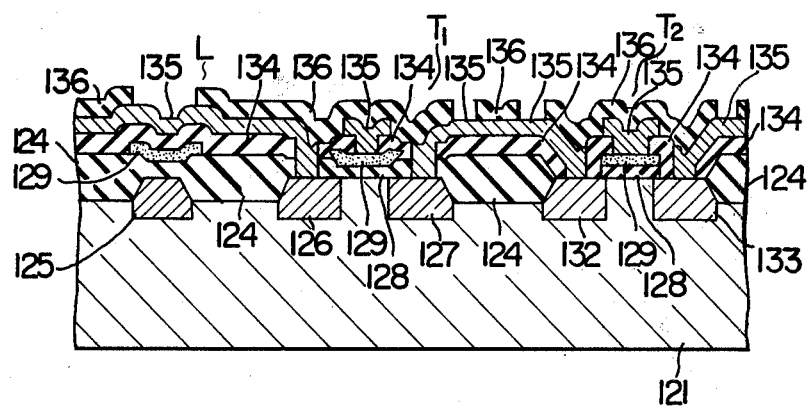

In FIG. 11, an oxide layer 134 has been formed on the top surface of the substrate by a vapor growth process, contact windows have been formed at desired areas of the oxide layer 134, an aluminum layer has been deposited thereon, aluminum layer electrode 135 has been formed by etching using a photoresist, an insulating protective layer 136 has been applied thereon as required, and openings for wire bondings have been formed in the protective layer. The processes to be made which follow for the structure shown in FIG. 10 are exactly the same as the process for a conventional silicon gate.

In the explanation of the steps described above, certain modifications may be made without departing from the spirit of the present invention. For example, in carrying out the non-self-alignment diffusion shown in FIG. 7, instead of diffusing the source region and the drain region while leaving the silicon nitride layer 122 unremoved, the silicon nitride layer 122 may be removed and a silicon oxide layer or other material may be deposited thermally or by vapor growth process to use it as a diffusion mask for the ource and the drain using a photoetching technology. In etching the silicon nitride layer, it has been frequently practiced to deposit silicon oxide on the surface of the silicon nitride layer, and to etch the silicon oxide to subsequently use it as an etching mask for etching the silicon nitride layer. It should be understood that the use of such technique is within the scope of the present invention. FIGS. 4 to 11 illustrate that the present invention can be practiced by a conventional technique. The materials used need not be limited to silicon, silicon oxide layer, silicon nitride layer and polysilicon layer specified in the above embodiment. While one half of the thickness of the grown oxide layer lies above the top surface of the silicon substrate in FIG. 6, it is possible in the process of FIG. 5 to remove the silicon nitride layer and then dig the silicon substrate at the areas of the openings of the silicon nitride layer, and grow the oxide layer until the top surface thereof reaches the level of the undug substrate surface. The use of such a technique is also within the scope of the present invention.

As is apparent from the above description, according to the manufacturing method of the present invention, the number of masks required and the number of times the mask alignment are minimized by virtue of the use of the selective oxidation technique using a mask having patterns for non-self-alignment and self-alignment, and hence the present method is very useful in manufacturing MOS LSI or BBD (bucket brigade device) LSI which requires a very precise mask alignment in the order of one to several microns. Furthermore, according to the present invention, the steps in the insulating layer underlying the metallized patterns are very small. Accordingly, the disadvantages of the reduction of the thickness of the metallized patterns extending over the steps and the formation of deep grooves are completely eliminated. As a result, it is possible to provide a semiconductor integrated circuit device which is free of breakages on the metallized pattern or breakages of metal wiring and in which the current capacity of the metallized patterns is not reduced.

What is claimed is:

1. A method of manufacturing a semiconductor integrated circuit device having insulated gate field effect transistors which employs both a self-alignment diffusion process for forming self-aligned transistors and interconnections and a non-self-alignment diffusion process for forming non-self-aligned transistors and interconnections, characterized in that said method comprises the steps of (a) forming an oxidation prevention layer of a material which prevents thermal oxidation of a semiconductor on the entire surface of a semiconductor substrate having a first type of conductivity;

(b) selectively removing said oxidation prevention layer by a photo-etching process using a mask having a perforated pattern for establishing areas on said substrate where said oxidation prevention layer is not removed and self-alignment diffusion and non-self-alignment diffusion will subsequently occur to respectively form said self-aligned and non-self-aligned transistors;

(c) carrying out a high temperature heating treatment to thermally oxidize those areas of said semiconductor substrate which are exposed and not covered by said oxidation prevention layer;

(d) removing said oxidation prevention layer from those areas on said substrate where non-self-alignment diffusion is to occur except areas which will correspond to the gates of non-self-aligned transistors, and thereafter carrying out a diffusion process to form first source and drain regions of the non-self-aligned transistors as well as first non-self-alignment interconnection regions, said first source, drain and interconnection regions having a second type of conductivity with respect to said substrate;

(e) removing all said oxidation prevention layers remaining over said substrate at those areas designated for self-alignment diffusion and all oxidation prevention layers remaining over said substrate at those areas designated for non-self-alignment diffusion to thereby expose said substrate, and, thereafter, forming a gate oxide film on said substrate over those exposed areas where the oxidation prevention layers have been removed;

(f) forming a gate electrode layer over the entire surface area of said substrate, and thereafter selectively removing said gate electrode layer to establish desired gate electrode regions where said gate electrode layer is not removed;

(g) selectively removing said gate oxide film using said gate electrode layers at the areas over said substrate designated for said self-alignment diffusion as a mask, and thereafter carrying out a diffusion process to form second source and drain regions of said self-aligned transistors as well as second self-aligned interconnection regions, said second source, drain and interconnection regions having said second type of conductivity; and (h) forming electrodes connected to specified regions of the resulting integrated circuit device.

2. A method for manufacturing a semiconductor integrated circuit device according to claim 1 wherein said oxidation prevention layers are silicon nitride layers.

3. A method for manufacturing a semiconductor integrated circuit device according to claim 1, wherein said oxidation prevention layers are formed on a thin oxide layer formed on said semiconductor substrate.

4. A method for manufacturing a semiconductor integrated circuit device according to claim 1, wherein prior to said thermal oxidation process those portions of said semiconductor substrate surface which are not covered by said oxidation prevention layers are dug to a predetermined depth and subsequently the thermal oxidation process is carried out.

* * * * *